United States Patent
Xu

(10) Patent No.: US 9,978,972 B2
(45) Date of Patent: May 22, 2018

(54) QUANTUM DOT LIGHT EMITTING DEVICE AND MANUFACTURE METHOD THEREOF AND LIQUID CRYSTAL DISPLAY DEVICE

(71) Applicant: Shenzhen China Star Optoelectronics Technology Co., Ltd., Shenzhen, Guangdong (CN)

(72) Inventor: Chao Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 170 days.

(21) Appl. No.: 15/039,426

(22) PCT Filed: Apr. 20, 2016

(86) PCT No.: PCT/CN2016/079714
§ 371 (c)(1),
(2) Date: May 26, 2016

(87) PCT Pub. No.: WO2017/161615
PCT Pub. Date: Sep. 28, 2017

(65) Prior Publication Data
US 2018/0083214 A1    Mar. 22, 2018

(30) Foreign Application Priority Data

Mar. 25, 2016    (CN) .......................... 2016 1 0179472

(51) Int. Cl.
*H01L 51/50* (2006.01)
*H01L 51/52* (2006.01)
(Continued)

(52) U.S. Cl.
CPC .......... *H01L 51/502* (2013.01); *G02F 1/1336* (2013.01); *H01L 51/0037* (2013.01);
(Continued)

(58) Field of Classification Search
CPC ............... H01L 51/502; H01L 51/0037; H01L 51/5221; H01L 51/5225; H01L 51/5234;
(Continued)

(56) References Cited

U.S. PATENT DOCUMENTS

| | | | |
|---|---|---|---|
| 2013/0335677 A1 | 12/2013 | You | |
| 2016/0248033 A1* | 8/2016 | Uesaka | ................. H01L 51/504 |

FOREIGN PATENT DOCUMENTS

| | | |
|---|---|---|
| CN | 2009199738 A | 9/2009 |
| CN | 101937975 A | 1/2011 |
| CN | 20120039940 A | 4/2012 |
| CN | 103346266 A | 10/2013 |

(Continued)

*Primary Examiner* — Selim Ahmed
(74) *Attorney, Agent, or Firm* — Andrew C. Cheng

(57) ABSTRACT

A quantum dot light emitting device includes a base plate and an anode, a hole transportation layer, a light emissive layer, an electron transportation layer, and a cathode arranged on the same side of the base plate. The anode and the cathode are opposite to and spaced from each other and receive the hole transportation layer, the light emissive layer, and the electron transportation layer to be interposed therebetween. The hole transportation layer is connected to the anode. The light emissive layer and the electron transportation layer are sequentially stacked on the hole transportation layer that is distant from the anode. The electron transportation layer is connected to the cathode. The light emissive layer includes a quantum dot light emitting material and a small-molecule organic light emitting material, which is filled in gaps present in the quantum dot light emitting material.

17 Claims, 3 Drawing Sheets

100

(51) Int. Cl.
*H01L 51/56* (2006.01)
*G02F 1/1335* (2006.01)
*H01L 51/00* (2006.01)

(52) U.S. Cl.
CPC ........ *H01L 51/504* (2013.01); *H01L 51/5206* (2013.01); *H01L 51/5221* (2013.01); *H01L 51/5225* (2013.01); *H01L 51/5234* (2013.01); *H01L 51/56* (2013.01); *G02F 2201/44* (2013.01); *H01L 51/5056* (2013.01); *H01L 51/5072* (2013.01); *H01L 2251/301* (2013.01); *H01L 2251/303* (2013.01); *H01L 2251/308* (2013.01); *H01L 2251/5307* (2013.01); *H01L 2251/5315* (2013.01); *H01L 2251/558* (2013.01)

(58) Field of Classification Search
CPC ... H01L 51/504; H01L 51/56; H01L 51/5206; H01L 2251/308; H01L 2251/301; H01L 2251/558; H01L 2251/5315; G02F 1/1336
See application file for complete search history.

(56) References Cited

FOREIGN PATENT DOCUMENTS

| | | | |
|---|---|---|---|
| CN | 103427049 | A | 12/2013 |
| CN | 103730584 | A | 4/2014 |
| CN | 2014057968 | A | 4/2014 |
| CN | 103779509 | A | 5/2014 |
| CN | 103956432 | A | 7/2014 |
| CN | 105185919 | A | 12/2015 |

* cited by examiner

QUANTUM DOT LIGHT EMITTING DEVICE AND MANUFACTURE METHOD THEREOF AND LIQUID CRYSTAL DISPLAY DEVICE

CROSS REFERENCE TO RELATED APPLICATIONS

This application claims the priority of Chinese Patent Application No. 201610179472.7 filed on Mar. 25, 2016, titled "Quantum Dot Light Emitting Device and Manufacture Method Thereof and Liquid Crystal Display Device", the disclosure of which is incorporated herein by reference in its entirety.

BACKGROUND OF THE INVENTION

1. Field of the Invention

The present invention relates to the field of display, and more particularly to a quantum dot light emitting device and a manufacture method thereof and a liquid crystal display device.

2. The Related Arts

Quantum dot light emitting devices, such as quantum dot light emitting diodes (QLEDs), have various advantages, such as wide gamut, high color purity, good stability, low power consumption, and low cost and are thus considered a new generation of lighting devices. Due to a quantum dot film of a quantum dot light emitting device having a reduced thickness and also due to agglomeration of quantum dot materials, relatively large gaps may be present between quantum dot materials of a quantum dot light emitting layer and this leads to a relatively large leakage current in the quantum dot light emitting device, which in turn results in poor performance of the quantum dot light emitting device.

SUMMARY OF THE INVENTION

The present invention provides a quantum dot light emitting device. The quantum dot light emitting device comprises a base plate, an anode, a hole transportation layer, a light emissive layer, an electron transportation layer, and a cathode. The anode, the hole transportation layer, the light emissive layer, the electron transportation layer, and the cathode are arranged on the same side of the base plate. The anode and the cathode are opposite to and spaced from each other. The hole transportation layer, the light emissive layer, and the electron transportation layer are interposed between the anode and the cathode. A surface of the hole transportation layer is connected to the anode. The light emissive layer and the electron transportation layer are sequentially stacked on a surface of the hole transportation layer that is distant from the anode. A surface of the electron transportation layer that is distant from the light emissive layer is connected to the cathode. The anode supplies holes. The hole transportation layer transports the holes to the light emissive layer. The cathode supplies electrons. The electron transportation layer transports the electrons to the light emissive layer. The holes and the electrons are re-combined in the light emissive layer to emit light, wherein the light emissive layer comprises a quantum dot light emitting material and a small-molecule organic light emitting material, and the small-molecule organic light emitting material is filled in gaps present in the quantum dot light emitting material.

In the above quantum dot light emitting device, a surface of the anode that is distant from the hole transportation layer is disposed on the base plate; the anode is a transparent electrode; the cathode is a metal electrode; and light generated by the re-combination of the holes and the electrons in the light emissive layer is projected out through a surface of the base plate that is distant from the anode.

In the above quantum dot light emitting device, the anode comprises indium tin oxide (ITO) and the cathode comprises aluminum (Al).

In the above quantum dot light emitting device, the cathode has a thickness of 100-150 nm.

In the above quantum dot light emitting device, a surface of the cathode that is distant from the electron transportation layer is disposed on the base plate; the cathode is a transparent electrode; the anode is a metal electrode; and the light generated by the re-combination of the holes and the electrons in the light emissive layer is projected out through a surface of the base plate that is distant from the cathode.

In the above quantum dot light emitting device, the light emissive layer comprises a first sub light emissive layer and a second sub light emissive layer that are stacked on each other; a surface of the first sub light emissive layer is in contact engagement with a surface of the hole transportation layer that is distant from the anode; a surface of the second sub light emissive layer is in contact engagement with a surface of the electron transportation layer that is distant from the cathode; the first sub light emissive layer comprises the quantum dot light emitting material and the small-molecule organic light emitting material; and the second sub light emissive layer comprises the small-molecule organic light emitting material.

In the above quantum dot light emitting device, the hole transportation layer comprises poly(3,4-ethylenedioxythiophene):poly styrenesulfonate (PEDOT:PSS) or P-type metal oxide nanometer particle, wherein the P-type metal oxide nanometer particle comprises one or multiple ones of $MoO_3$, $NiO$, $V_2O_5$, and $WO_3$.

In the above quantum dot light emitting device, the hole transportation layer has a thickness of 40 nm.

The present invention also provides a manufacture method of a quantum dot light emitting device, which comprises:

providing a base plate and forming an anode on a surface of the base plate;

coating a hole transportation material on a surface of the anode that is distant from the base plate to form a hole transportation layer;

depositing a quantum dot light emitting material on a surface of the hole transportation layer that is distant from the anode;

depositing a small-molecule organic light emitting material on a surface of the quantum dot light emitting material that is distant from the hole transportation layer such that the small-molecule organic light emitting material fills in gaps present in the quantum dot light emitting material to form a light emissive layer;

coating an electron transportation material on a surface of the light emissive layer that is distant from the hole transportation layer to form an electron transportation layer; and forming a cathode on a surface of the electron transportation layer that is distant from the light emissive layer.

The present invention further provides a liquid crystal display device, which comprises a quantum dot light emitting device as described above.

Compared to the prior art, the present invention provides a quantum dot light emitting device having a light emissive layer that comprises a quantum dot light emitting material and a small-molecule organic light emitting material, and the small-molecule organic light emitting material is filled in gaps present in the quantum dot light emitting material. Thus, the gaps present in the quantum dot light emitting material can be reduced; leakage current of the quantum dot light emitting device can be lowered down; and performance of the quantum dot light emitting device can be improved. Further, the small-molecule organic light emitting material can be self-luminous in order to improve the lighting brightness of the quantum dot light emitting device, and the light emission efficiency of quantum dot can be enhanced through energy transfer.

BRIEF DESCRIPTION OF THE DRAWINGS

To more clearly explain the technical solution proposed in an embodiment of the present invention and that of the prior art, a brief description of the drawings that are necessary for describing embodiments is given as follows. It is obvious that the drawings that will be described below show only some embodiments. For those having ordinary skills of the art, other drawings may also be readily available from these attached drawings without the expense of creative effort and endeavor.

DETAILED DESCRIPTION OF THE PREFERRED EMBODIMENTS

A clear and complete description will be given to a technical solution of embodiments of the present invention with reference to the attached drawings of the embodiments of the present invention. However, the embodiments so described are only some, but not all, of the embodiments of the present invention. Other embodiments that are available to those having ordinary skills of the art without the expense of creative effort and endeavor are considered belonging to the scope of protection of the present invention.

Figure 1:
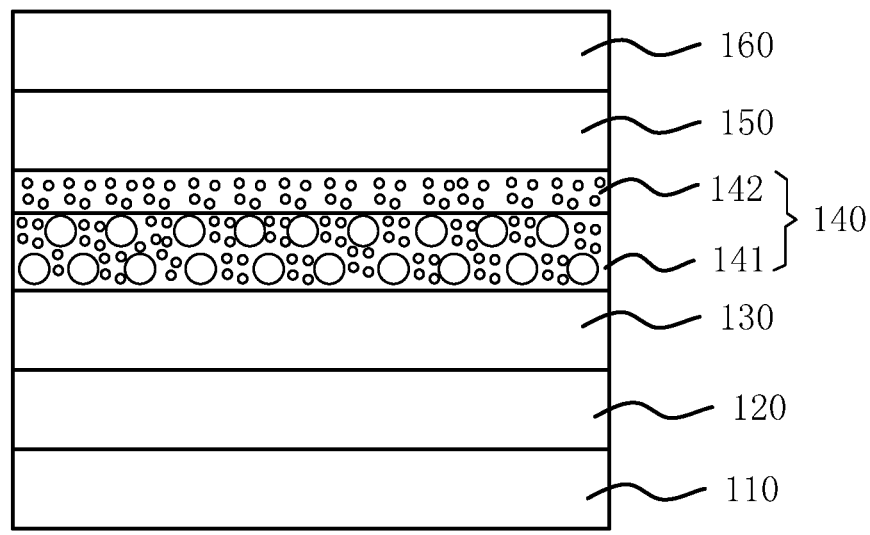
FIG. 1 is a schematic view illustrating a quantum dot light emitting device according to a preferred embodiment of the present invention.

Referring to FIG. 1, FIG. 1 is a schematic view illustrating a quantum dot light emitting device according to a preferred embodiment of the present invention. The quantum dot light emitting device 100 comprises a base plate 110, an anode 120, a hole transportation layer 130, a light emissive layer 140, an electron transportation layer 150, and a cathode 160. The anode 120, the hole transportation layer 130, the light emissive layer 140, the electron transportation layer 150, and the cathode 160 are arranged on the same side of the base plate 110. The anode 110 and the cathode 160 are arranged opposite to each other and are spaced from each other. The hole transportation layer 130, the light emissive layer 140, and the electron transportation layer 150 are interposed between the anode 120 and the cathode 160. A surface of the hole transportation layer 130 is connected to the anode 120 and the light emissive layer 140 and the electron transportation layer 150 are disposed on a surface of the hole transportation layer 130 that is distant from the anode 110. A surface of the electron transportation layer 150 that is distant from the light emissive layer 140 is connected to the cathode 160. The anode 120 supplies holes, and the hole transportation layer 130 transport the holes to the light emissive layer 140. The cathode 160 supplies electrons, and the electron transportation layer 150 transports the electrons to the light emissive layer 140. The holes and the electrons are re-combined with each other in the light emissive layer 140 to emit light. The light emissive layer 140 comprises a quantum dot light emitting material and a small-molecule organic light emitting material. The small-molecule organic light emitting material is filled in gaps present in the quantum dot light emitting material.

The base plate 110 is a transparent plate. The base plate 110 can be, but not limited to, a glass plate or a plastic plate.

The small-molecule organic light emitting material as referred to in the present invention is an organic light emitting material having a molecular weigh of 500-2000.

In the instant embodiment, a surface of the anode 120 that is distant from the hole transportation layer 130 is disposed on the base plate 110. The anode 120 is a transparent electrode and the cathode 160 is a metal electrode. Light generated due to re-combination of the holes and the electrons in the light emissive layer 140 is projected out through a surface of the base plate 110 that is distant from the anode 120. In one embodiment, the anode 120 comprises indium tin oxide (ITO) and the cathode 160 comprises, but not limited to, aluminum (Al). The cathode 160 has a thickness of 100-150 nm.

It is appreciated that in other embodiments, a surface of the cathode 160 that is distant from the electron transportation layer 150 can be disposed on the base plate 1101; and the cathode 160 is a transparent electrode and the anode 120 is a metal electrode; and light generated by the re-combination of the holes and the electrons is the light emissive layer 140 is projected out through a surface of the base plate 110 that is distant from the cathode 160.

The light emissive layer 140 comprises a first sub light emissive layer 141 and a second sub light emissive layer 142 that are stacked on each other. A surface of the first sub light emissive layer 141 is in contact engagement with a surface of the hole transportation layer 130 that is distant from the anode 120 and a surface of the second sub light emissive layer 142 is in contact engagement with a surface of the electron transportation layer 150 that is distant from the cathode 160. The first sub light emissive layer 141 comprises the quantum dot light emitting material and the small-molecule organic light emitting material, and the second sub light emissive layer 142 comprises the small-molecule organic light emitting material.

The hole transportation layer 130 comprises poly(3,4-ethylenedioxythiophene):poly styrenesulfonate (PEDOT:PSS) or P-type metal oxide nanometer particles. The P-type metal oxide nanometer particles comprise one or multiple ones of $MoO_3$, $NiO$, $V_2O_5$, and $WO_3$. Preferably, the hole transportation layer 130 has a thickness of 40 nm.

Compared to the prior art, the present invention provides a quantum dot light emitting device 100 having a light emissive layer 140 that comprises a quantum dot light emitting material and a small-molecule organic light emitting material, and the small-molecule organic light emitting material is filled in gaps present in the quantum dot light emitting material. Thus, the gaps present in the quantum dot light emitting material can be reduced; leakage current of the quantum dot light emitting device 100 can be lowered down; and performance of the quantum dot light emitting device 100 can be improved. Further, the small-molecule organic light emitting material can be self-luminous in order to improve the lighting brightness of the quantum dot light emitting device 100, and the light emission efficiency of quantum dot can be enhanced through energy transfer.

Figure 2:
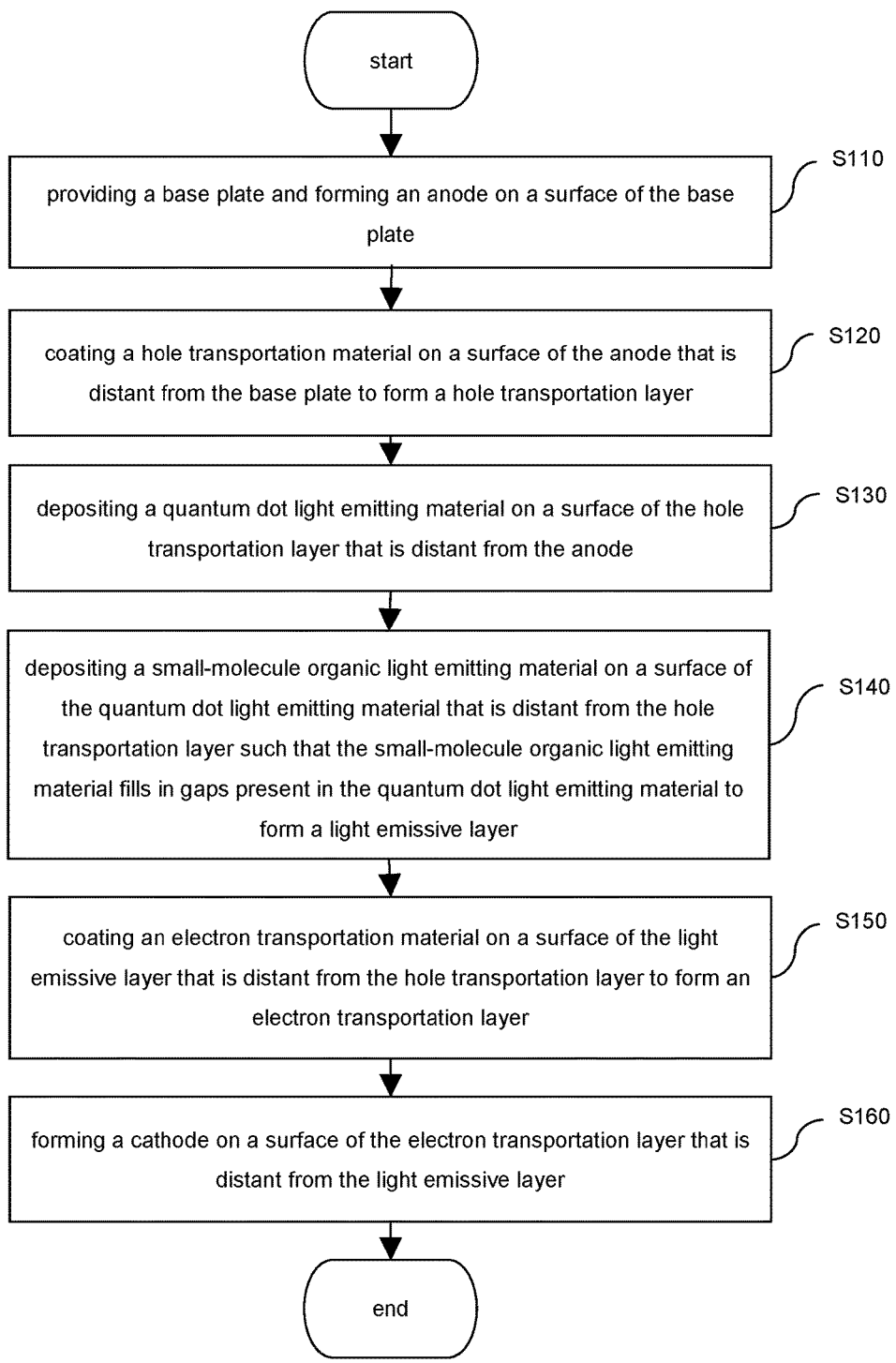
FIG. 2 is a flow chart illustrating a manufacture method of a quantum dot light emitting device according to a preferred embodiment of the present invention.

A description will be given to a manufacture method of a quantum dot light emitting device according to the present invention, with reference to FIG. 1 and the description given above in association with the quantum dot light emitting device 100. Referring to FIG. 2, FIG. 2 is a flow chart illustrating a manufacture method of a quantum dot light emitting device according to a preferred embodiment of the present invention. The manufacture method of a quantum dot light emitting device comprises, but not limited to, the following steps.

Step S110: providing a base plate 110 and forming an anode 120 on a surface of the base plate 110.

Step S120: coating a hole transportation material on a surface of the anode 120 that is distant from the base plate 110 to form a hole transportation layer 130. Specifically, in one embodiment, a process, such as spin coating, may be adopted to coat the hole transportation material on the surface of the anode 120 that is distant from the base plate 110 so as to form the hole transportation layer 130.

Step S130: depositing a quantum dot light emitting material on a surface of the hole transportation layer 130 that is distant from the anode 120. Forming of the quantum dot light emitting material can also be achieved with spray coating, spin coating, or inkjet printing. The quantum dot light emitting material has a thickness of 10-40 nm.

Step S140: depositing a small-molecule organic light emitting material on a surface of the quantum dot light emitting material that is distant from the hole transportation layer such that the small-molecule organic light emitting material fills in gaps present in the quantum dot light emitting material to form a light emissive layer 140. The small-molecule organic light emitting material has a size smaller than that of the quantum dot light emitting material, so that a portion of the small-molecule organic light emitting material may get filled into the gaps present in the quantum dot light emitting material, whereby the light emissive layer 140 contains both the quantum dot light emitting material and the small-molecule organic light emitting material. The small-molecule organic light emitting material can be formed by means of deposition such as vapor deposition.

Step S150: coating an electron transportation material on a surface of the light emissive layer 140 that is distant from the hole transportation layer 130 to form an electron transportation layer 150.

Step S160: forming a cathode 160 on a surface of the electron transportation layer 150 that is distant from the light emissive layer 140. Forming of the cathode 160 can be achieved with vapor deposition.

Figure 3:
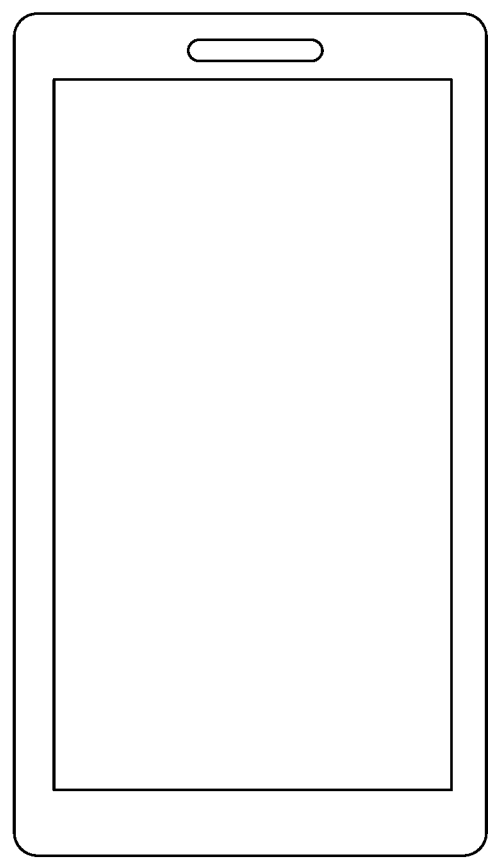
FIG. 3 is a schematic view illustrating a liquid crystal display device according to a preferred embodiment of the present invention.

The present invention also provides a liquid crystal display device 10. Referring to FIG. 3, the liquid crystal display device 10 comprises the quantum dot light emitting device 100 that has been described previously and thus, repeated description will be omitted here. The liquid crystal display device 10 can be a portable electronic device, which includes, but not limited to, a smart phone, a mobile internet device (MID), an electronic book, a play station portable (PSP), or a personal digital assistant (PDA), or a monitor.

The present invention has been described with reference to the preferred embodiments. However, it is noted that those skilled in the art would appreciates that various improvements and modifications are still available without departing from the scope of the present invention and such improvements and modifications are considered within the scope of protection of the present invention.

What is claimed is:

1. A quantum dot light emitting device, comprising a base plate, an anode, a hole transportation layer, a light emissive layer, an electron transportation layer, and a cathode, the anode, the hole transportation layer, the light emissive layer, the electron transportation layer and the cathode being arranged on the same side of the base plate, the anode and the cathode being opposite to and spaced from each other, the hole transportation layer, the light emissive layer, and the electron transportation layer being interposed between the anode and the cathode, a surface of the hole transportation layer being connected to the anode, the light emissive layer and the electron transportation layer being sequentially stacked on a surface of the hole transportation layer that is distant from the anode, a surface of the electron transportation layer that is distant from the light emissive layer being connected to the cathode, the anode supplying holes, the hole transportation layer transporting the holes to the light emissive layer, the cathode supplying electrons, the electron transportation layer transporting the electrons to the light emissive layer, the holes and the electrons being re-combined in the light emissive layer to emit light, wherein the light emissive layer comprises a quantum dot light emitting material and a small-molecule organic light emitting material, the small-molecule organic light emitting material being filled in gaps present in the quantum dot light emitting material;

wherein the light emissive layer comprises a first sub light emissive layer that is formed of a mixture of multiple materials comprising the quantum dot light emitting material and the small-molecule organic light emitting material and a second sub light emissive layer that is formed of a signal substance comprising only the small-molecule organic light emitting material, the second sub light emissive layer being deposited on the first sub light emissive layer to allow the small-molecule organic light emitting material to penetrate into gaps present in the quantum dot light emitting material of the first sub light emissive layer to form the mixture of multiple materials.

2. The quantum dot light emitting device as claimed in claim 1, wherein a surface of the anode that is distant from the hole transportation layer is disposed on the base plate, the anode being a transparent electrode, the cathode being a metal electrode, light generated by the re-combination of the holes and the electrons in the light emissive layer being projected out through a surface of the base plate that is distant from the anode.

3. The quantum dot light emitting device as claimed in claim 2, wherein the anode comprises indium tin oxide (ITO) and the cathode comprises aluminum (Al).

4. The quantum dot light emitting device as claimed in claim 3, wherein the cathode has a thickness of 100-150 nm.

5. The quantum dot light emitting device as claimed in claim 1, wherein a surface of the cathode that is distant from the electron transportation layer is disposed on the base plate, the cathode being a transparent electrode, the anode being a metal electrode, the light generated by the re-combination of the holes and the electrons in the light emissive layer being projected out through a surface of the base plate that is distant from the cathode.

6. The quantum dot light emitting device as claimed in claim 1, wherein a surface of the first sub light emissive layer that is opposite to the second sub light emissive layer is in contact engagement with a surface of the hole transportation layer that is distant from the anode, and a surface of the second sub light emissive layer that is opposite to the first sub light emissive layer is in contact engagement with a surface of the electron transportation layer that is distant from the cathode.

7. The quantum dot light emitting device as claimed in claim 1, wherein the hole transportation layer comprises poly(3,4-ethylenedioxythiophene):poly styrenesulfonate (PEDOT:PSS) or P-type metal oxide nanometer particle, wherein the P-type metal oxide nanometer particle comprises one or multiple ones of $MoO_3$, NiO, $V_2O_5$, and WO3.

8. The quantum dot light emitting device as claimed in claim 1, wherein the hole transportation layer has a thickness of 40 nm.

9. A manufacture method of a quantum dot light emitting device, comprising:
- providing a base plate and forming an anode on a surface of the base plate;
- coating a hole transportation material on a surface of the anode that is distant from the base plate to form a hole transportation layer;
- depositing a quantum dot light emitting material on a surface of the hole transportation layer that is distant from the anode;
- depositing a small-molecule organic light emitting material on a surface of the quantum dot light emitting material that is distant from the hole transportation layer such that the small-molecule organic light emitting material fills in gaps present in the quantum dot light emitting material to form a light emissive layer;
- coating an electron transportation material on a surface of the light emissive layer that is distant from the hole transportation layer to form an electron transportation layer; and
- forming a cathode on a surface of the electron transportation layer that is distant from the light emissive layer;
- wherein the light emissive layer comprises a first sub light emissive layer that is formed of a mixture of multiple materials comprising the quantum dot light emitting material and the small-molecule organic light emitting material and a second sub light emissive layer that is formed of a signal substance comprising only the small-molecule organic light emitting material, the second sub light emissive layer being deposited on the first sub light emissive layer to allow the small-molecule organic light emitting material to penetrate into gaps present in the quantum dot light emitting material of the first sub light emissive layer to form the mixture of multiple materials.

10. A liquid crystal display device, comprising a quantum dot light emitting device, the quantum dot light emitting device comprising a base plate, an anode, a hole transportation layer, a light emissive layer, an electron transportation layer, and a cathode, the anode, the hole transportation layer, the light emissive layer, the electron transportation layer and the cathode being arranged on the same side of the base plate, the anode and the cathode being opposite to and spaced from each other, the hole transportation layer, the light emissive layer, and the electron transportation layer being interposed between the anode and the cathode, a surface of the hole transportation layer being connected to the anode, the light emissive layer and the electron transportation layer being sequentially stacked on a surface of the hole transportation layer that is distant from the anode, a surface of the electron transportation layer that is distant from the light emissive layer being connected to the cathode, the anode supplying holes, the hole transportation layer transporting the holes to the light emissive layer, the cathode supplying electrons, the electron transportation layer transporting the electrons to the light emissive layer, the holes and the electrons being re-combined in the light emissive layer to emit light, wherein the light emissive layer comprises a quantum dot light emitting material and a small-molecule organic light emitting material, the small-molecule organic light emitting material being filled in gaps present in the quantum dot light emitting material;
- wherein the light emissive layer comprises a first sub light emissive layer that is formed of a mixture of multiple materials comprising the quantum dot light emitting material and the small-molecule organic light emitting material and a second sub light emissive layer that is formed of a signal substance comprising only the small-molecule organic light emitting material, the second sub light emissive layer being deposited on the first sub light emissive layer to allow the small-molecule organic light emitting material to penetrate into gaps present in the quantum dot light emitting material of the first sub light emissive layer to form the mixture of multiple materials.

11. The liquid crystal display device as claimed in claim 10, wherein a surface of the anode that is distant from the hole transportation layer is disposed on the base plate, the anode being a transparent electrode, the cathode being a metal electrode, light generated by the re-combination of the holes and the electrons in the light emissive layer being projected out through a surface of the base plate that is distant from the anode.

12. The liquid crystal display device as claimed in claim 11, wherein the anode comprises indium tin oxide (ITO) and the cathode comprises aluminum (Al).

13. The liquid crystal display device as claimed in claim 12, wherein the cathode has a thickness of 100-150 nm.

14. The liquid crystal display device as claimed in claim 10, wherein a surface of the cathode that is distant from the electron transportation layer is disposed on the base plate, the cathode being a transparent electrode, the anode being a metal electrode, the light generated by the re-combination of the holes and the electrons in the light emissive layer being projected out through a surface of the base plate that is distant from the cathode.

15. The liquid crystal display device as claimed in claim 10, wherein a surface of the first sub light emissive layer that is opposite to the second sub light emissive layer is in contact engagement with a surface of the hole transportation layer that is distant from the anode, and a surface of the second sub light emissive layer that is opposite to the first sub light emissive layer is in contact engagement with a surface of the electron transportation layer that is distant from the cathode.

16. The liquid crystal display device as claimed in claim 10, wherein the hole transportation layer comprises poly(3,4-ethylenedioxythiophene):poly styrenesulfonate (PEDOT:PSS) or P-type metal oxide nanometer particle, wherein the P-type metal oxide nanometer particle comprises one or multiple ones of $MoO_3$, NiO, $V_2O_5$, and WO3.

17. The liquid crystal display device as claimed in claim 10, wherein the hole transportation layer has a thickness of 40 nm.

* * * * *